US012581713B2

(12) United States Patent
Williams et al.

(10) Patent No.: US 12,581,713 B2
(45) Date of Patent: Mar. 17, 2026

(54) VIA ALTERNATE NET SPACING

(71) Applicant: QUALCOMM Incorporated, San Diego, CA (US)

(72) Inventors: Thomas Hua-Min Williams, Irvine, CA (US); Luis Chen, Chula Vista, CA (US); Bed Raj Kandel, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 811 days.

(21) Appl. No.: 17/886,805

(22) Filed: Aug. 12, 2022

(65) Prior Publication Data

US 2024/0055494 A1     Feb. 15, 2024

(51) Int. Cl.
  *H10D 64/23*          (2025.01)
  *H10D 64/27*          (2025.01)
(52) U.S. Cl.
  CPC ......... *H10D 64/254* (2025.01); *H10D 64/513* (2025.01)
(58) Field of Classification Search
  CPC .... H10D 64/254; H10D 64/513; H10D 30/62; H10D 89/10; H01L 23/5226; H01L 23/5227; H01L 23/5283; H01L 23/5286; H01L 23/528
  USPC ....................................................... 257/288
  See application file for complete search history.

(56) References Cited

U.S. PATENT DOCUMENTS

| | | | |
|---|---|---|---|
| 7,365,431 B2 | 4/2008 | Matsubara | |
| 8,872,344 B2 | 10/2014 | Mair | |
| 9,935,057 B2 * | 4/2018 | Yu | H10D 89/10 |
| 10,867,111 B2 * | 12/2020 | Kim | G06F 30/392 |
| 11,081,479 B1 | 8/2021 | Tsai et al. | |
| 2016/0240539 A1 | 8/2016 | Mojumder et al. | |
| 2016/0372414 A1 | 12/2016 | Song et al. | |
| 2021/0390240 A1 * | 12/2021 | Chang | H01L 23/528 |
| 2022/0237357 A1 | 7/2022 | Peng et al. | |
| 2023/0282514 A1 * | 9/2023 | Peng | H01L 23/528 |

FOREIGN PATENT DOCUMENTS

| | | |
|---|---|---|
| CN | 103545250 A | 1/2014 |
| CN | 103489867 B | 12/2017 |
| CN | 109952642 A | 6/2019 |
| CN | 107210295 B | 11/2020 |

OTHER PUBLICATIONS

International Search Report and Written Opinion—PCT/US2023/025520—ISA/EPO—Sep. 5, 2023.

* cited by examiner

*Primary Examiner* — Monica D Harrison
(74) *Attorney, Agent, or Firm* — Loza & Loza, LLP

(57)          ABSTRACT

A chip includes a first net, and a second net, wherein the first net and the second net are formed from a same metal layer, and the second net neighbors the first net. The chip also includes first vias disposed on the first net, and second vias disposed on the second net. A first spacing is greater than a second spacing, the first spacing is between a first one of the first vias and a second one of the first vias, the first one of the first vias and the second one of the first vias are adjacent, and the second spacing is between the first one of the first vias and one of the second vias closest to the first one of the first vias.

14 Claims, 8 Drawing Sheets

FIG. 4

VIA ALTERNATE NET SPACING

BACKGROUND

Field

Aspects of the present disclosure relate generally to chip layout, and, more particularly, to layout of vias on a chip.

Background

A chip (i.e., die) includes integrated devices (e.g., transistors) and a stack of metal layers that provide routing for the devices. The chip may also include vias that provide electrical coupling between the metal layers. With advances in chip fabrication, the dimensions of structures on a chip continue to scale down. As dimensions become smaller, the parasitic resistances of vias on the chip continue to increase, which negatively impacts the performance of the chip.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a chip. The chip includes a first net, and a second net, wherein the first net and the second net are formed from a same metal layer, and the second net neighbors the first net. The chip also includes first vias disposed on the first net, and second vias disposed on the second net. A first spacing is greater than a second spacing, the first spacing is between a first one of the first vias and a second one of the first vias, the first one of the first vias and the second one of the first vias are adjacent, and the second spacing is between the first one of the first vias and one of the second vias closest to the first one of the first vias.

A second aspect relates to a chip. The chip includes a first net, and a second net, wherein the first net and the second net are formed from a same metal layer, and the second net neighbors the first net. The chip also includes first vias disposed on the first net, and second vias disposed on the second net. A first spacing is between a first one of the first vias and a second one of the first vias, the first one of the first vias and the second one of the first vias are adjacent, a second spacing is between the first one of the first vias and one of the second vias closest to the first one of the first vias, and each of the first spacing and the second spacing is within a range of a minimum spacing specified by a design rule to 1.1 times the minimum spacing.

BRIEF DESCRIPTION OF THE DRAWINGS

FIG. 4 shows an example of routing according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
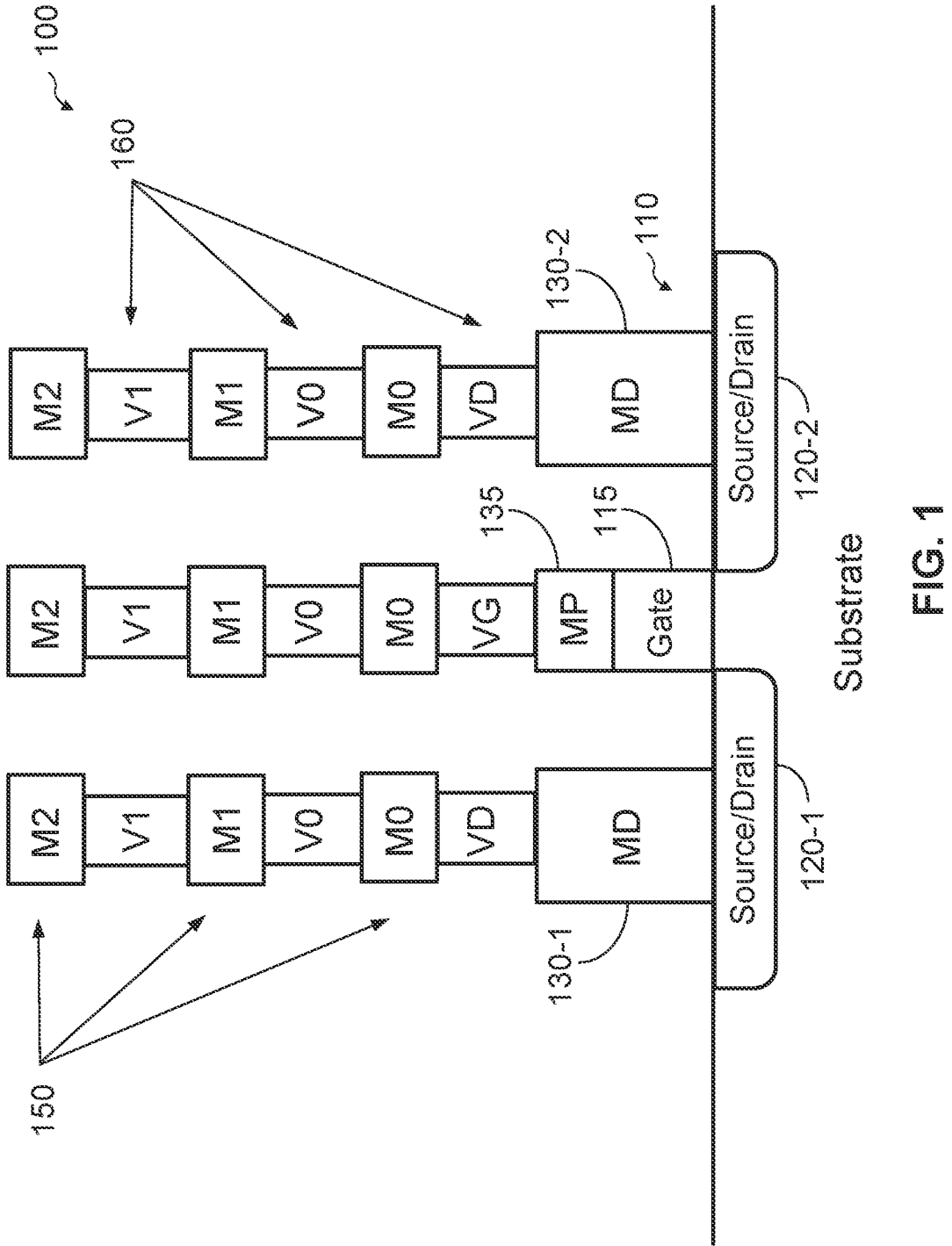
FIG. 1 shows a side view of an example of a chip including metal layers and vias according to certain aspects of the present disclosure.

FIG. 1 shows a side view of an example of a chip 100 (i.e., die) according to certain aspects. The chip 100 may include many devices (e.g., transistors) integrated on the chip 100. In this regard, FIG. 1 shows an example of a transistor 110 integrated on the chip 100. Although one transistor 110 is shown in FIG. 1 for simplicity, it is to be appreciated that the chip 100 may include many transistors.

In the example shown in FIG. 1, the transistor 110 includes a gate 115, a first source/drain 120-1, and a second source/drain 120-2. As used herein, the term "source/drain" means source or drain. The gate 115 is formed over a channel between the first source/drain 120-1 and the second source/drain 120-2, in which the gate 115 controls the conductivity of the channel based on the potential (i.e., voltage) applied to the gate 115. The transistor 110 may also include a thin gate oxide (not shown) between the gate and the channel. The gate 115 may be a poly-silicon gate, a metal gate, or another type of gate. In the example shown in FIG. 1, the transistor 110 is depicted as a planar transistor. However, it is to be appreciated that the transistor 110 may be implemented with a fin field-effect transistor (FinFET), an example of which is discussed below with reference to FIGS. 2A and 2B.

The chip 100 may also include a first source/drain contact 130-1 formed on the first source/drain 120-1, and a second source/drain contact 130-2 formed on the second source/drain 120-2. The source/drain contacts 130-1 and 130-2 may be formed from a source/drain contact layer (labeled "MD" in FIG. 1) using, for example, a lithographic process and an etching process. Although the source/drain contact layer is labeled "MD" in the example in FIG. 1, it is to be appreciated that the source/drain contact layer may also be labeled "CA" or another label.

The chip 100 may also include a gate contact 135 formed on the gate 115. The gate contact 135 may be formed from a gate contact layer (labeled "MP" in FIG. 1) using, for example, a lithographic process and an etching process. Although the gate contact layer is labeled "MP" in the example in FIG. 1, it is to be appreciated that the gate contact layer may also be labeled with another label.

The chip 100 may also include a stack of metal layers 150 (also referred to as a metal layer stack). The metal layers 150 are patterned (e.g., using lithography and etching) to provide metal routing for the transistor 110 and other devices (not shown) on the chip 100. The metal routing may be used, for example, to interconnect devices on the chip 100, couple devices to a power source, couple devices to one or more input/output (I/O) pins, etc. In the example in FIG. 1, the bottom-most metal layer may be designated metal layer M0 (also referred to as metal 0), the metal layer immediately above metal layer M0 may be designated metal layer M1 (also referred to as metal 1), the metal layer immediately above metal layer M1 may be designated metal layer M2 (also referred to as metal 2), and so forth. Although three metal layers are shown in FIG. 1 for ease of illustration, it is to be appreciated that the chip 100 may include additional metal layers (e.g., five or more metal layers including metal layer M3, metal layer M4, and so forth). It is to be appreciated that the present disclosure is not limited to the nomenclature in which the bottom-most metal layer is designated metal layer M0. For instance, in another example, the bottom-most metal layer may be designated metal layer M1 instead of metal layer M0.

The chip 100 also includes vias 160 that provide electrical coupling between the metal layers 150, and between metal layer M0 and the contacts 130-1, 130-2, and 135. In this example, the vias VD provide electrical coupling between the source/drain contacts 130-1 and 130-2 and metal layer M0, and the via VG provides electrical coupling between the gate contact 135 and metal layer M0. The vias VO provide electrical coupling between metal layer M0 and metal layer M1, and the vias VI provide electrical coupling between metal layer M1 and metal layer M2.

Figure 2A:
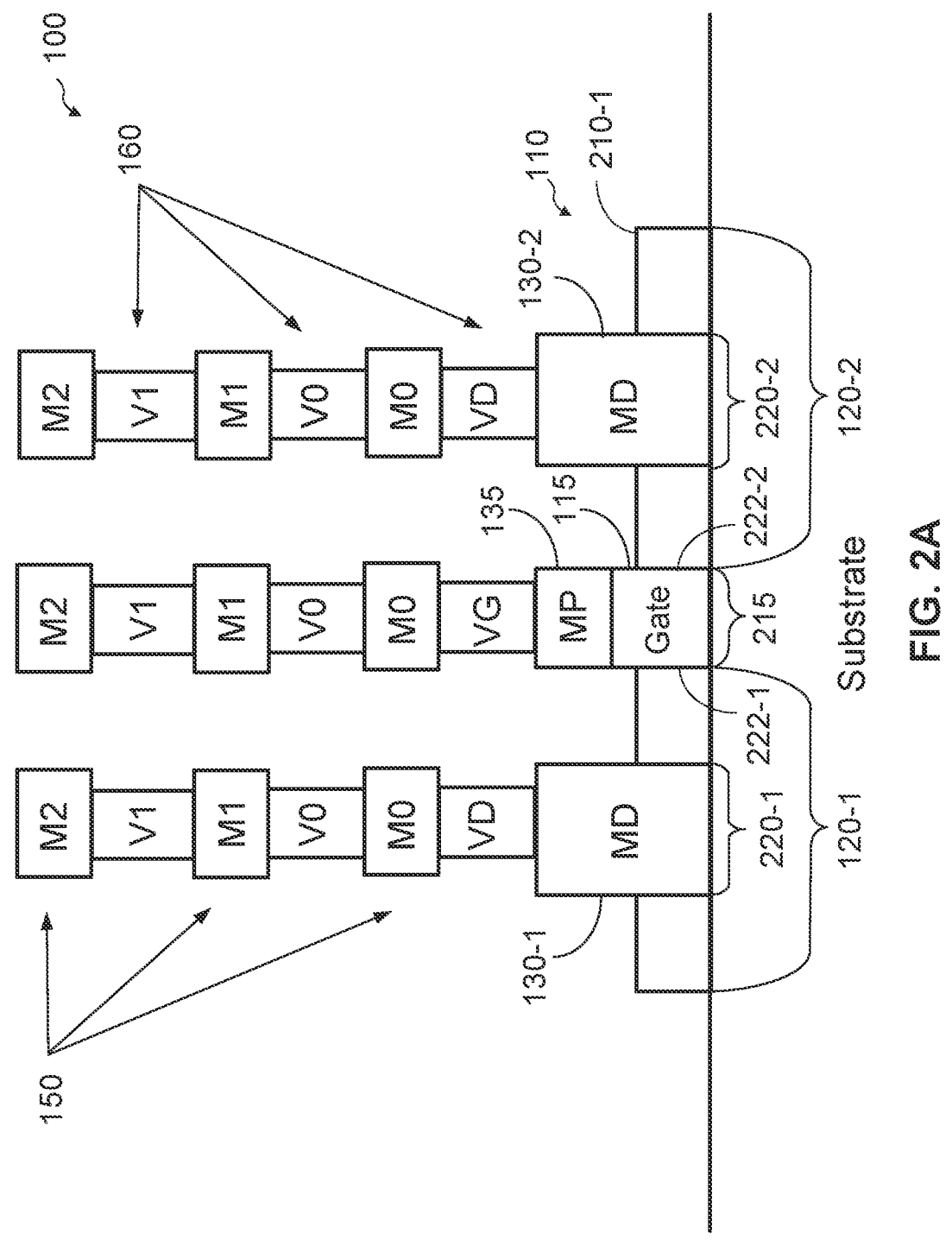
FIG. 2A shows a side view of an example of a fin field-effect transistor (FinFET) according to certain aspects of the present disclosure.
Figure 2B:
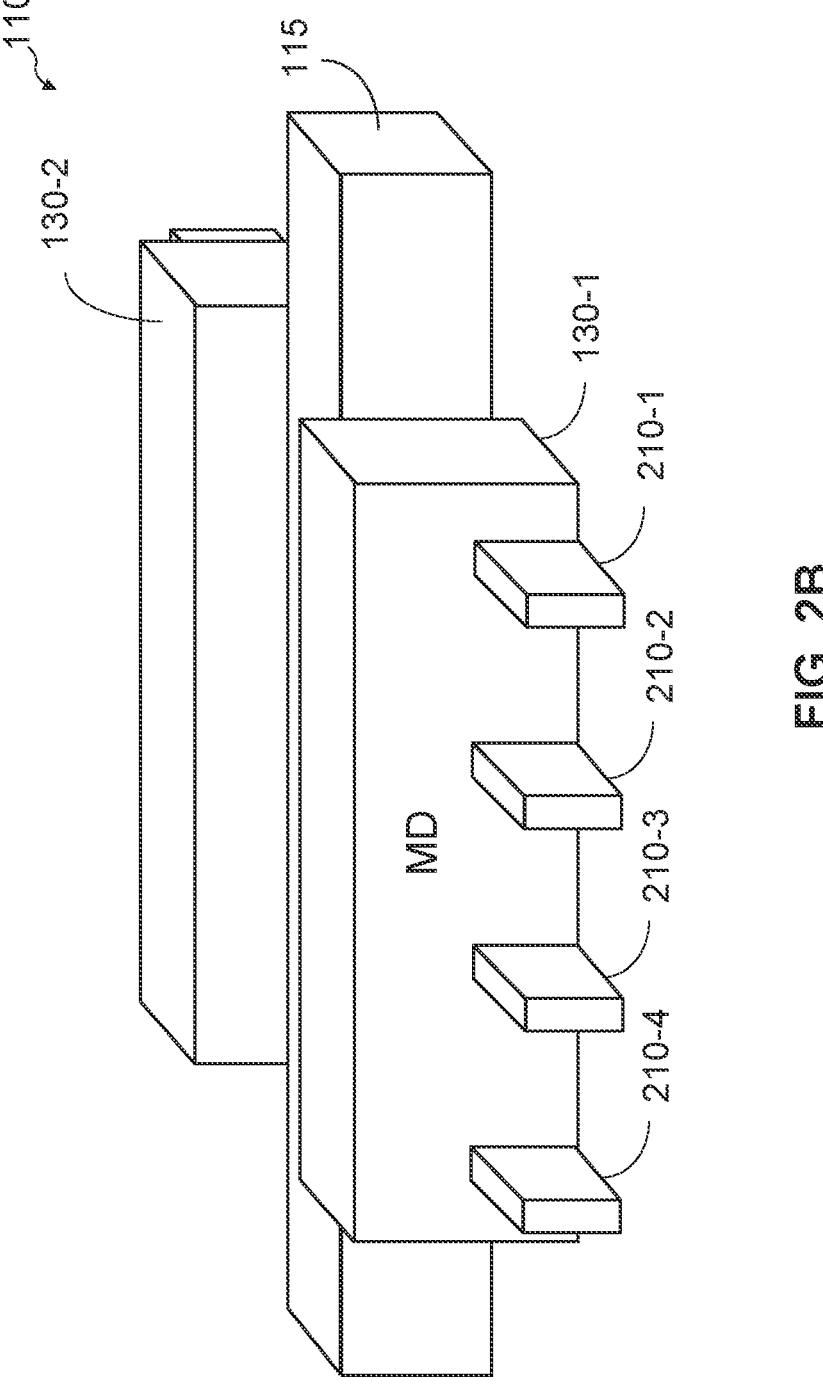
FIG. 2B shows a top view of the FinFET according to certain aspects of the present disclosure.

FIG. 2A shows a side view and FIG. 2B shows a perspective view of an example in which the transistor 110 is implemented with a FinFET. In this example, the transistor 110 includes fins 210-1 to 210-4 that extend perpendicularly with respect to the gate 115 and the source/drain contacts 130-1 and 130-2 (shown in FIG. 2B). Although four fins 210-1 to 210-4 are shown in the example in FIG. 2B, it is to be understood that the transistor 110 may include a different number of fins. Also, although the fins 210-1 to 210-4 are shown as having rectangular cross sections, it is to be understood that the fins may having other cross-sectional shapes (e.g., tapered cross sections). Note that the metal layers 150, the vias 160, and the gate contact 135 are not explicitly shown in FIG. 2B.

In this example, the gate 115 is formed over a first portion 215 of the fins 210-1 to 210-4. The first portion 215 of the fins 210-1 to 210-4 forms a channel of the transistor 110, in which the gate 115 controls the conductance of the channel based on the potential (i.e., voltage) applied to the gate 115. The gate 115 may wrap around three or more sides of each fin (e.g., the top side and two opposite sidewalls of each fin). In this example, the transistor 110 may also include a thin dielectric layer (not shown) interposed between the fins 210-1 to 210-4 and the gate 115. As shown in FIG. 2A, the gate contact 135 may be formed on the gate 115, and the via VG may electrically couple the gate contact 135 to metal layer M0.

A portion of the fins 210-1 to 210-4 extending from a first side 222-1 of the gate 115 forms the first source/drain 120-1, and a portion of the fins 210-1 to 210-4 extending from a second side 222-2 of the gate 115 forms the second source/drain 120-2, in which the first side 222-1 and the second side

222-2 are opposite sides of the gate 115. In this example, the first source/drain contact 130-1 is formed over a second portion 220-1 of the fins 210-1 to 210-4 on the first side 222-1 of the gate 115, and the second source/drain contact 130-2 is formed over a third portion 220-2 of the fins 210-1 to 210-4 on the second side 222-2 of the gate 115. Each of the source/drain contacts 130-1 to 130-2 may be made of a conductive material (e.g., one or more metals). As shown in FIG. 2A, the vias VD may electrically couple the source/drain contacts 130-1 to 130-2 to metal layer M0.

It is to be appreciated that the transistor 110 may include additional structures not shown in FIGS. 2A and 2B. For example, the transistor 110 may include sidewall spacers on the first and second sides 222-1 and 222-2 of the gate 115.

Figure 3:
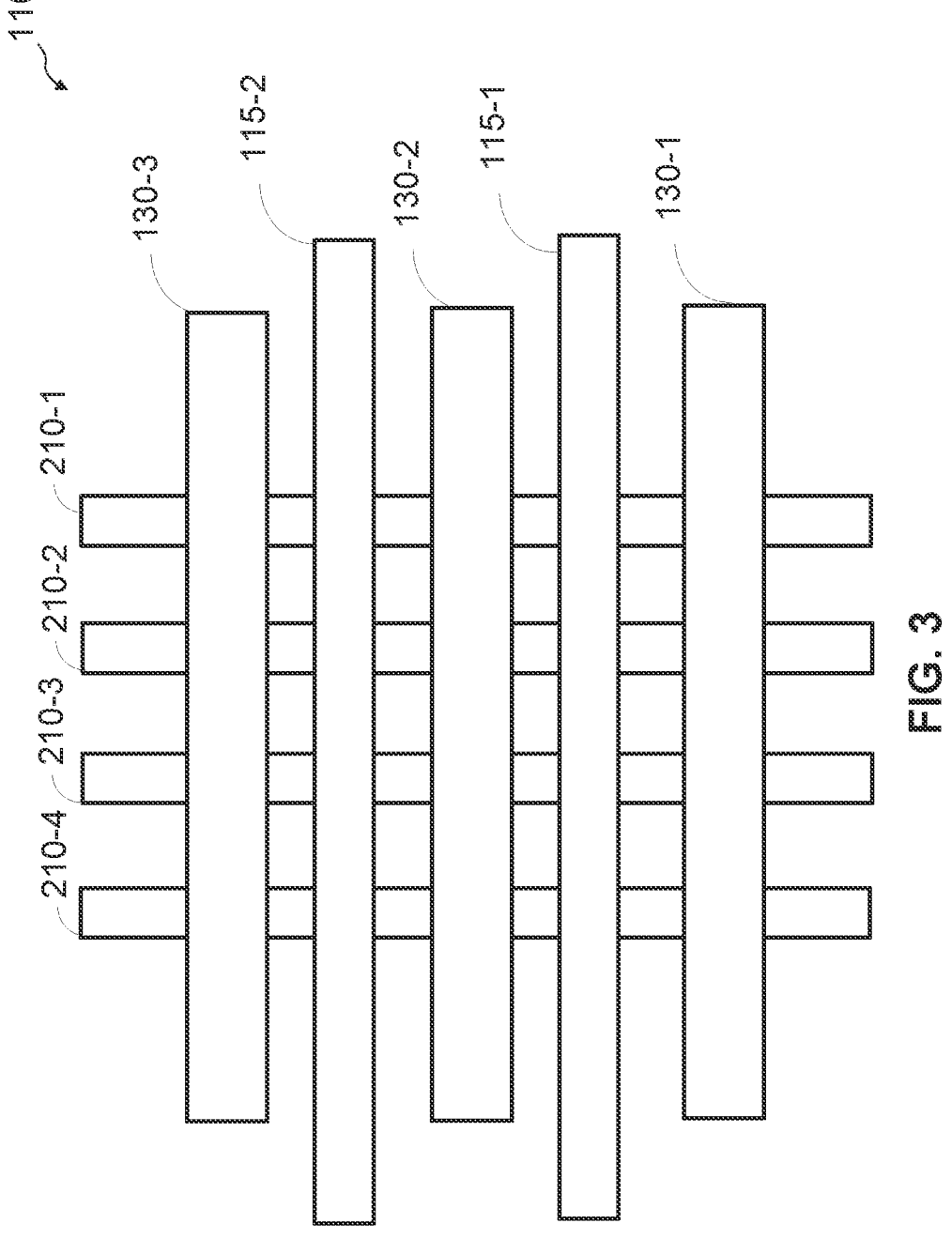
FIG. 3 shows a top view of an example of a multi-gate transistor according to certain aspects of the present disclosure.

In certain aspects, the transistor 110 may be implemented with a multi-gate transistor also referred to as a multi-finger transistor) including multiple gates. In this regard, FIG. 3 shows a top view in which the transistor 110 includes multiple gates including a first gate 115-1 and a second gate 115-2. The first gate 115-1 may correspond to the gate 115 discussed above. The first gate 115-1 and the second gate 115-2 run (i.e., extend) parallel to each other. Although two gates are shown in the example in FIG. 3, it is to be appreciated that the transistor 110 may include more than two gates. The gates 115-1 and 115-2 may be electrically coupled to each other through metal routing (not shown) formed from one or more of the metal layers 150 and two or more of the vias 160.

In the example shown in FIG. 3, the transistor 110 includes the fins 210-1 to 210-4 which extend perpendicularly with respect to the gates 115-1 and 115-2. The first gate 115-1 and the second gate 115-2 are formed over the fins 210-1 to 210-4, as shown in FIG. 3. In this example, the transistor 110 includes the first source/drain contact 130-1 and the second source/drain contact 130-2 formed over the fins 210-1 to 210-4. The transistor 110 also includes a third source/drain contact 130-3 formed over the fins 210-1 to 210-4. The source/drain contacts 130-1 to 130-3 run (i.e., extend) in parallel to each other and in parallel to the gates 115-1 and 115-2. In this example, the first source/drain contact 130-1 and the second source/drain contact 130-2 are located on opposite sides of the first gate 115-1, and the second source/drain contact 130-2 and the third source/drain contact 130-3 are located on opposite sides of the second gate 115-2. Also, in this example, the second source/drain contact 130-2 is located between the first gate 115-1 and the second gate 115-2.

Figure 4:
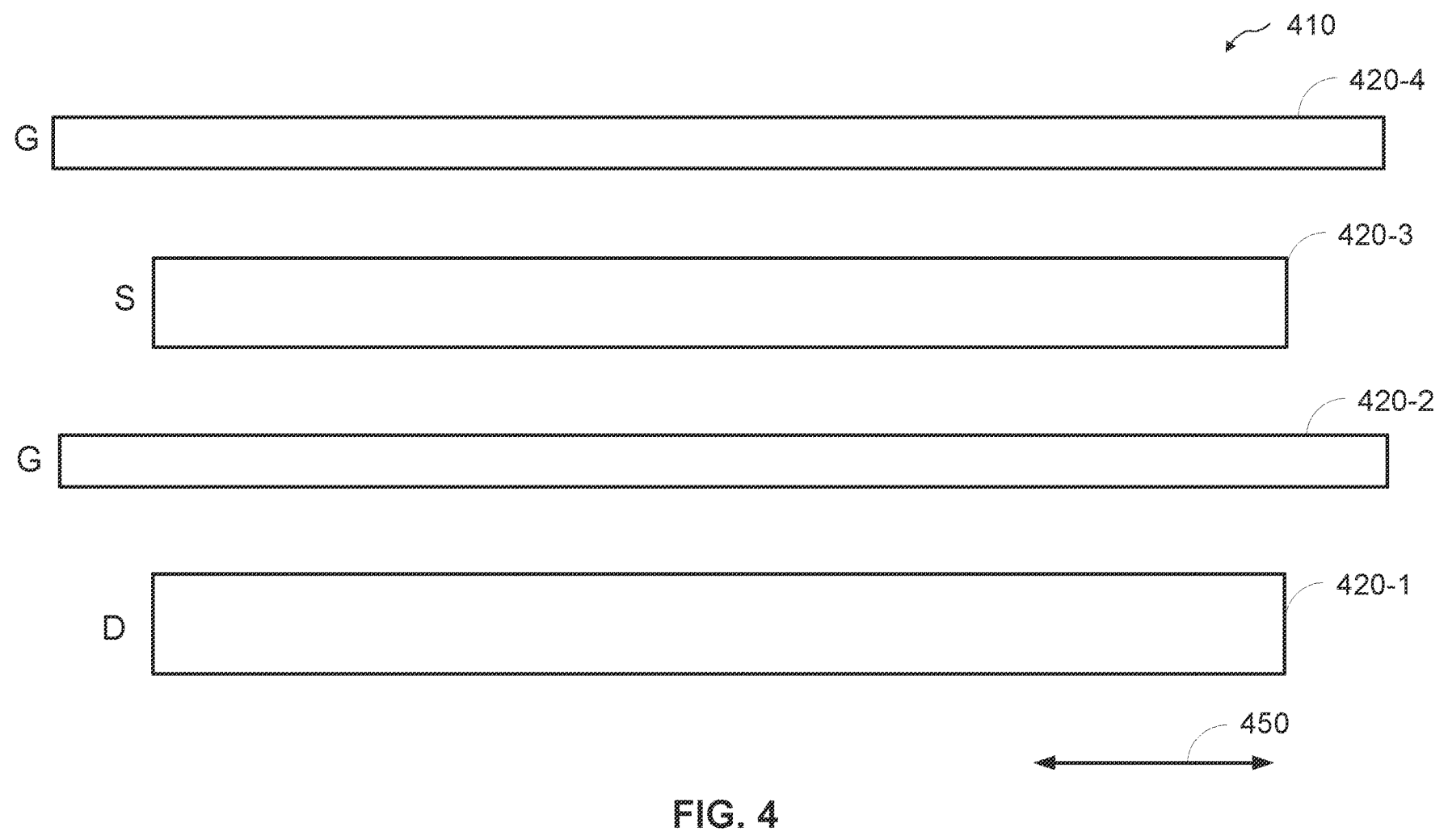

FIG. 4 shows a top view of an example of routing 410 according to certain aspects. The routing 410 may be used, for example, to provide routing for the transistor 110. The routing 410 includes a first net 420-1, a second net 420-2, a third net 420-3, and a fourth net 420-4. In this example, the first net 420-1, the second net 420-2, the third net 420-3, and the fourth net 420-4 are formed from the same metal layer (e.g., one of metal layer M1, metal layer M2, etc.). For example, the first net 420-1, the second net 420-2, the third net 420-3, and the fourth net 420-4 may be formed from the same metal layer using a lithographic process and an etching process that patterns the metal layer into the individual nets 420-1, 420-2, 420-3, and 420-4. In this example, each of the nets 420-1, 420-2, 420-3, and 420-4 extends in lateral direction 450. As used herein, the term "lateral" refers to a direction that runs parallel to the substrate of the chip 100.

In the example in FIG. 4, each of the nets 420-1, 420-2, 420-3, and 420-4 is shown as a respective contiguous metal line extending in lateral direction 450 with the nets 420-1, 420-2, 420-3, and 420-4 running parallel to each other.

However, it is to be appreciated that the present disclosure is not limited to this example. In general, each of the nets 420-1, 420-2, 420-3, and 420-4 may be a respective contiguous metal path formed from a metal layer (e.g., one of metal layer M1, metal layer M2, etc.). As used herein, a "net" is a contiguous metal path formed from a metal layer. Nets may be formed from the same metal layer by patterning the metal layer into the individual nets (e.g., using lithography and etching).

FIG. 4 shows an example in which the routing 410 is used for a transistor (e.g., transistor 110). However, it is to be appreciated that the routing 410 is not limited to this example. In the example in FIG. 4, the first net 420-1 may provide routing for a drain of the transistor (e.g., transistor 110). For example, the first net 420-1 may be electrically coupled to the first source/drain 120-1. In this example, the first net 420-1 may be electrically coupled to the first source/drain 120-1 by the first source/drain contact 130-1, vias, and one or more intermediate metal layers (i.e., one or more metal layers between the first source/drain 120-1 and the metal layer used to form the first net 420-1). For an example where the first net 420-1 is formed from metal layer M1, the one or more intermediate metal layers may include metal layer M0. For an example where the first net 420-1 is formed from metal layer M2, the one or more intermediate metal layers may include metal layer M0 and metal layer M. For an example where the first net 420-1 is formed from metal layer M0, there may be no intermediate metal layer. In this example, the first net 420-1 may be coupled to the first source/drain contact 130-1 by one or more vias VD.

In the example in FIG. 4, the second net 420-2 may provide routing for a first gate of the transistor (e.g., transistor 110). For example, the second net 420-2 may be electrically coupled to the first gate 115-1. In this example, the second net 420-2 may be electrically coupled the first gate 115-1 by the respective gate contact (e.g., gate contact 135), vias, and one or more intermediate metal layers (i.e., one or more metal layers between the first gate 115-1 and the metal layer used to form the second net 420-2). For the example where the second net 420-2 is formed from metal layer M1, the one or more intermediate metal layers may include metal layer M0. For the example where the second net 420-2 is formed from metal layer M2, the one or more intermediate metal layers may include metal layer M0 and metal layer M1. For an example where the second net 420-2 is formed from metal layer M0, there may be no intermediate metal layer. In this example, the second net 420-2 may be coupled to the first gate 115-1 by one or more vias VG.

In the example in FIG. 4, the third net 420-3 may provide routing for a source of the transistor (e.g., transistor 110). For example, the third net 420-3 may be electrically coupled to the second source/drain 120-2. In this example, the third net 420-3 may be electrically coupled the second source/drain 120-2 by the second source/drain contact 130-2, vias, and one or more intermediate metal layers (i.e., one or more metal layers between the second source/drain 120-2 and the metal layer used to form the third net 420-3). For an example where the third net 420-3 is formed from metal layer M1, the one or more intermediate metal layers may include metal layer M0. For an example where the third net 420-3 is formed from metal layer M2, the one or more intermediate metal layers may include metal layer M0 and metal layer M1. For an example where the third net 420-3 is formed from metal layer M0, there may be no intermediate metal layer. In this example, the third net 420-3 may be coupled to the second source/drain contact 130-2 by one or more vias VD.

In the example in FIG. 4, the fourth net 420-4 may provide routing for a second gate of the transistor (e.g., transistor 110). For example, the fourth net 420-4 may be electrically coupled to the second gate 115-2. In this example, the fourth net 420-4 may be electrically coupled the second gate 115-2 by the respective gate contact, vias, and one or more intermediate metal layers (i.e., one or more metal layers between the second gate 115-2 and the metal layer used to form the fourth net 420-4). For an example where the fourth net 420-4 is formed from metal layer M1, the one or more intermediate metal layers may include metal layer M0. For an example where the fourth net 420-4 is formed from metal layer M2, the one or more intermediate metal layers may include metal layer M0 and metal layer M1. For an example where the fourth net 420-4 is formed from metal layer M0, there may be no intermediate metal layer. In this example, the fourth net 420-4 may be coupled to the second gate 115-2 by one or more vias VG.

It is to be appreciated that the routing 410 is not limited to the example shown in FIG. 4, and that the routing 410 may include one or more additional nets in additional to the nets 420-1, 420-2, 420-3, and 420-4 shown in FIG. 4. For example, the routing 410 may include a fifth net (not shown) for the third source/drain 130-3 shown in FIG. 3.

Vias may be placed on the nets 420-1, 420-2, 420-3, and 420-4 to electrically couple the nets 420-1, 420-2, 420-3, and 420-4 to a metal layer that is above the metal layer used to form the nets 420-1, 420-2, 420-3, and 420-4. For example, when the nets 420-1, 420-2, 420-3, and 420-4 are formed from metal layer M1, the vias may electrically couple the nets 420-1, 420-2, 420-3, and 420-4 to metal layer M2. However, it is to be appreciated that the present disclosure is not limited to this example.

The placement of vias on the nets 420-1, 420-2, 420-3, and 420-4 may be governed by design rules, which may be specified by a chip foundry or another entity. For example, the design rules may define a minimum spacing between vias. In this example, the design rules may allow the spacing between vias to be equal to or greater than the minimum spacing but not less than the minimum spacing. During chip layout, the placement of the vias on the nets 420-1, 420-2, 420-3, and 420-4 may be checked for compliance with the design rules in a process called design rule checking (DRC). The DRC helps ensure that the final layout of the vias on the nets 420-1, 420-2, 420-3, and 420-4 complies with the design rules.

As the dimensions of vias become smaller with advances in chip fabrication, the parasitic resistances of vias on the chip 100 continue to increase which negatively impacts the performance of the chip 100. One approach to reduce parasitic resistance is to place multiple vias on the same net, in which the spacing between the vias is equal to the minimum spacing between vias allowed by the design rules. Using the minimum spacing between vias allows more vias to be placed on the net, which increases the number of vias in parallel between the net and the metal layer above the net (i.e., increases parallelization of the vias). The increased parallelization of the vias reduces the parasitic resistance due to the vias.

Figure 5:
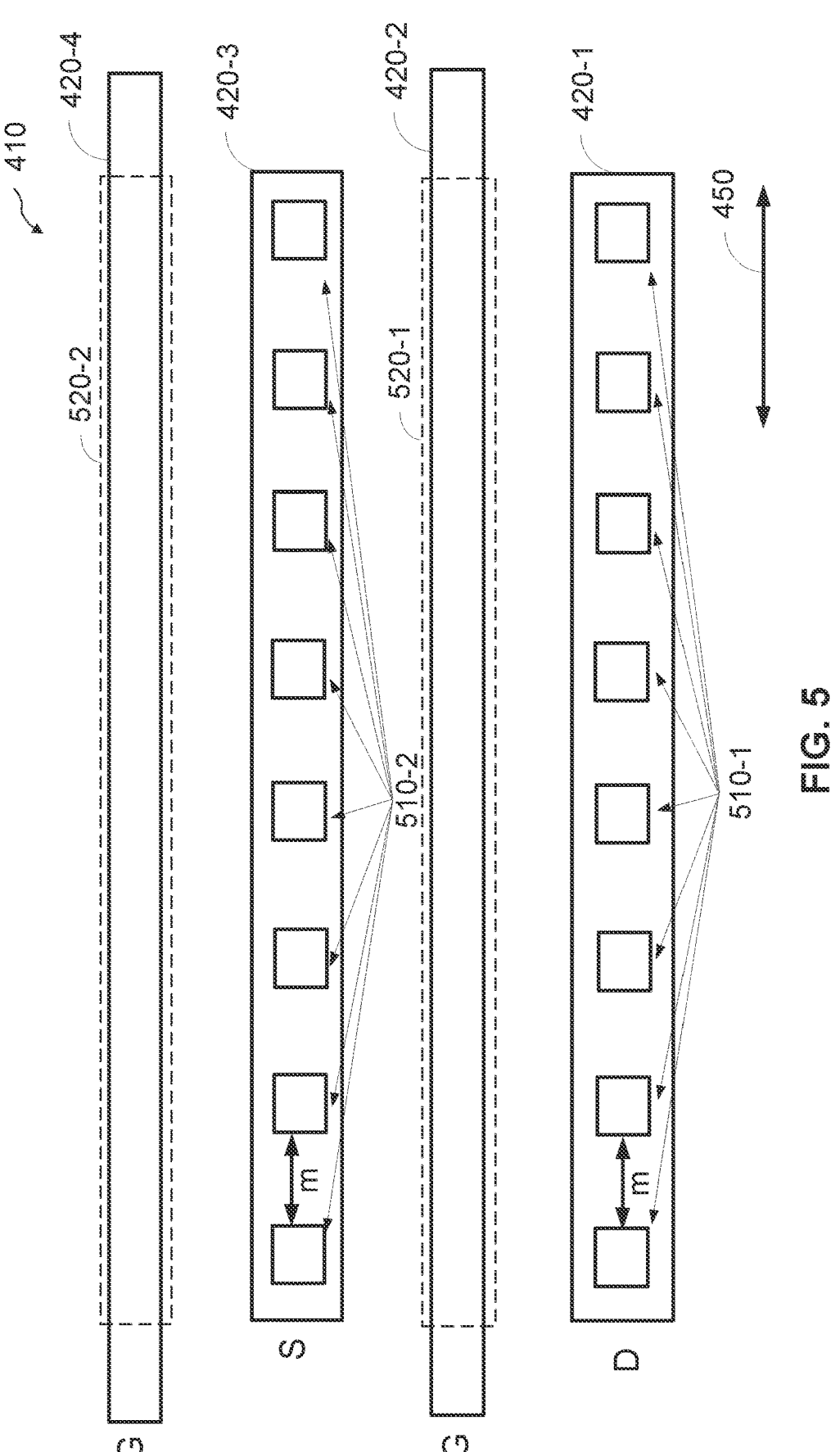
FIG. 5 shows an example of a layout using minimum spacing between vias on the same net according to certain aspects of the present disclosure.

An example of the above approach is shown in FIG. 5 according to certain aspects. FIG. 5 shows an example of vias 510-1 disposed on the first net 420-1. The vias 510-1 may electrically couple the first net 420-1 to another net (not shown) formed from a metal layer that is above the metal layer used to form the first net 420-1. For example, if the first net 420-1 is formed from metal layer M1, then the other net may be formed from metal layer M2. However, it is to be appreciated that the present disclosure is not limited to this example.

FIG. 5 also shows an example of vias 510-2 disposed on the third net 420-3. For example, the vias 510-2 may electrically couple the third net 420-3 to another net (not shown) formed from a metal layer that is above the metal layer used to form the third net 420-3. For example, if the third net 420-3 is formed from metal layer M1, then the other net may be formed from metal layer M2. However, it is to be appreciated that the present disclosure is not limited to this example.

In this example, the spacing between the vias 510-1 on the first net 420-1 is equal to a minimum spacing between vias allowed by design rules. In FIG. 5, the minimum spacing is labeled "in". In this example, placing the vias 510-1 on the first net 420-1 with the minimum spacing allows more vias to be placed on the first net 420-1 for increased parallelization and reduced parasitic resistance.

Similarly, the spacing between the vias 510-2 on the third net 420-3 is equal to the minimum spacing between vias. In this example, placing the vias 510-2 on the third net 420-3 with the minimum spacing allows more vias to be placed on the third net 420-3 for increased parallelization and reduced parasitic resistance.

Thus, in this example, the minimum via spacing on the first net 420-1 and the third net 420-3 increases via parallelization and reduces parasitic resistance for these nets 420-1 and 420-3. For the example where the first net 420-1 provides drain routing for the transistor 110 and the third net 420-3 provides source routing for the transistor 110, the minimum via spacing can significantly reduce the drain resistance and the source resistance.

However, the minimum via spacing on the first net 420-1 and the third net 420-3 may lead to exclusion zones 520-1 and 520-2 on the neighboring nets (i.e., the second net 420-2 and the fourth net 420-4) within which the design rules do not allow the placement of other vias. The exclusion zones 520-1 and 520-2 (also referred to as keep-out zones) may significantly restrict the placement of vias on the second net 420-2 and the fourth net 420-4. For example, the exclusion zone 520-1 may restrict the placement of vias on the second net 420-2 to the ends of the second net 420-2 outside the exclusion zone 520-1. The same may apply to the fourth net 420-4. In other words, electrical connections to the nets 420-2 and 420-4 may be pushed away from the nets 420-1 and 420-3.

As a result, the exclusion zones 520-1 and 520-2 may prevent or significantly reduce the ability of the nets 420-2 to 420-4 to utilize via parallelization to reduce parasitic resistance. For the example where the second net 420-2 and the fourth net 420-4 provide gate routing for the transistor 110, the exclusion zones 520-1 and 520-2 may result in high gate resistance. Accordingly, via layouts that reduce overall parasitic resistance (e.g., over all terminals of the transistor 110) are desirable.

Aspects of the present disclosure provide via layouts that use non-minimum spacing for vias on the same net. This helps prevent exclusion zones (e.g., exclusion zones 520-1 and 520-2) on neighboring nets (e.g., nets 420-2 and 420-4), allowing parallelization of vias on the neighboring nets. The parallelization of vias on the neighboring nets reduces parasitic resistance for the neighboring nets, which results in an overall reduction in parasitic resistance (e.g., across all terminals of a transistor such as the transistor 110), as discussed further below.

As used herein, "non-minimum spacing" refers to a spacing that is greater than the minimum spacing between vias specified by design rules. The design rules may be provided by a foundry (also referred to as a "fab"), and may be defined for the fabrication process used to fabricate the chip 100. It is to be appreciated that design rules may vary by foundries, and may be different for different fabrication processes. As used herein, a net is a "neighboring net" to another net when there is no intervening net between the two nets at the same metal layer (i.e., no intervening net formed from the same metal layer as the two nets). A neighboring net may also be referred to as an adjacent net or an alternate net. As used herein, a spacing between vias on the same net may refer to the spacing between adjacent vias on the same net. As used herein, a spacing between vias on two nets may refer to a spacing between one of the vias on one of the nets and a closest one of the vias on the other one of the nets. As used herein, the "spacing" between two vias may be the closest spacing between an edge of one of the vias and an edge of the other one of the vias.

Figure 6:
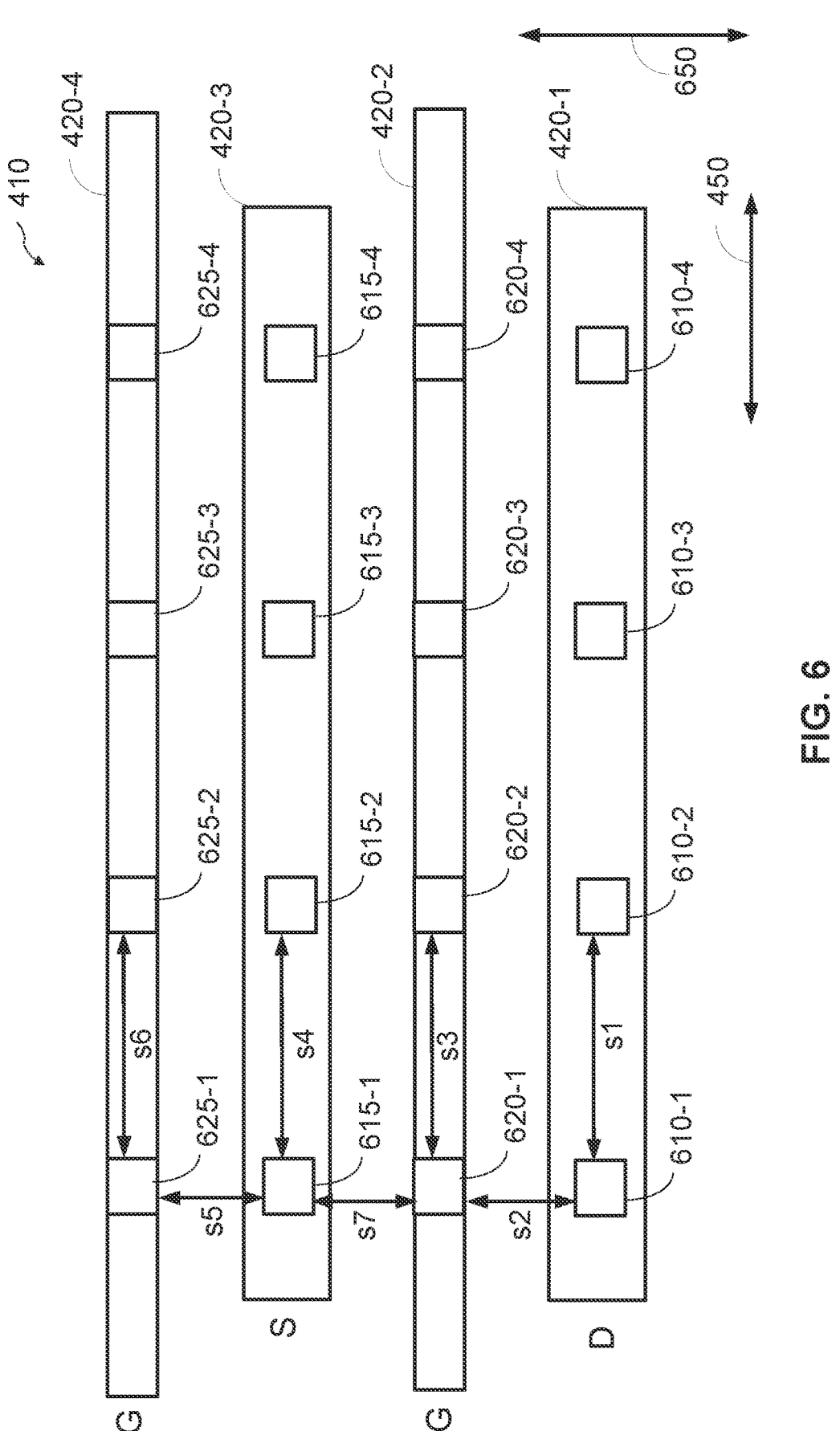
FIG. 6 shows an example of a layout using non-minimum spacing between vias on the same net according to certain aspects of the present disclosure.

FIG. 6 shows an example of a via layout using non-minimum spacing for vias on the same net according to certain aspects. The vias in this example may be patterned from a via layer using a lithographic process and an etching process. In certain aspects, the lithographic process may use multiple masks to define the vias instead of a single mask. Using multiple masks to define the vias may increase costs due to the addition of one or more extra masks. However, using multiple masks may provide finer via features, which may facilitate closer spacing between vias in one or more lateral directions, as discussed further below.

In the example in FIG. 6, the nets 420-1, 420-2, 420-3, and 420-4 extend in lateral direction 450, and are spaced apart from one another in lateral direction 650, where lateral direction 650 is perpendicular to lateral direction 450.

In the example in FIG. 6, vias 610-1 to 610-4 are disposed on the first net 420-1. The vias 610-1 to 610-4 may electrically couple the first net 420-1 to another net (not shown) formed from a metal layer that is above the metal layer used to form the first net 420-1. For example, if the first net 420-1 is formed from metal layer M1, then the other net may be formed from metal layer M2. However, it is to be appreciated that the present disclosure is not limited to this example.

In this example, the spacing s1 between the vias 610-1 to 610-4 on the first net 420-1 is greater than the minimum spacing between vias specified by the design rules of the fabrication process used to fabricate the chip 100. In one example, the spacing s1 between the vias 610-1 to 610-4 on the first net 420-1 is greater than 1.1 times the minimum spacing. In another example, the spacing s1 between the vias 610-1 to 610-4 on the first net 420-1 is greater than 1.3 times the minimum spacing. In yet another example, the spacing s1 between the vias 610-1 to 610-4 on the first net 420-1 is greater than 1.5 times the minimum spacing. In the example in FIG. 6, the spacing s1 is equal to the spacing between adjacent vias 610-1 to 610-4 on the first net 420-1. Note that the spacing s1 is in lateral direction 450 in this example since the first net 420-1 extends in lateral direction 450.

Thus, in this example, the spacing s1 between the vias 610-1 to 610-4 on the first net 420-1 is greater than the minimum spacing between vias specified by the design rules. In this example, the greater spacing s1 removes the exclusion zone 520-1 on the second net 420-2 shown in FIG. 5. The removal of the exclusion zone 520-1 allows vias to be placed on the second net 420-2, which neighbors the first net 420-1. In this regard, FIG. 6 shows an example of vias 620-1 to 620-4 disposed on the second net 420-2. The vias 620-1 to 620-4 on the second net 420-2 provide parallelization of vias on the second net 420-2, which reduces the parasitic resistance of the second net 420-2 compared with FIG. 5. Thus, the exemplary layout shown in FIG. 6 allows for parallelization of vias on the second net 420-2 (i.e., the neighboring net to the first net 420-1).

In one example, the via spacing s2 between the second net 420-2 and the first net 420-1 tray be equal to the minimum spacing between vias specified by the design rules (i.e., s2=m). The via spacing s2 may refer to the spacing between one of the vias 620-1 to 610-4 on the second net 420-2 and a closest one of the vias 610-1 to 610-4 on the first net 420-1, as shown in FIG. 6. For example, the via spacing s2 may refer to the spacing between via 620-1 on the second net 420-1 and via 610-1 on the first net 420-1 where via 610-1 is the via on the first net 420-1 that is closest to via 620-1. In the example in FIG. 6, the spacing s2 is in lateral direction 650.

Thus, in this example, the minimum spacing between vias is used for the via spacing s2 between the first net 420-1 and the second net 420-2 (i.e., neighboring nets) instead of the spacing s1 between the vias 610-1 to 610-4 on the first net 420-1 (i.e., the same net). However, it is to be appreciated that the present disclosure is not limited to this example, and that the via spacing s2 may be greater than the minimum spacing. For example, the vias spacing s2 may be within a range of the minimum spacing to 1.1 times the minimum spacing. In general, the spacing s1 between the vias 610-1 to 610-4 on the first net 420-1 (i.e., the same net) is greater than the via spacing s2 between the first net 420-1 and the second net 420-2 (i.e., neighboring nets). In one example, the ratio of the spacing s1 to the spacing s2 is equal to or greater than 1.1. In another example, the ratio of the spacing s1 to the spacing s2 is equal to or greater than 1.3. In yet another example, the ratio of the spacing s1 to the spacing s2 is equal to or greater than 1.5.

The greater spacing s1 between the vias 610-1 to 610-4 in FIG. 6 compared with FIG. 5 slightly increases the parasitic resistance of the first net 420-1 due to reduced parallelization of the vias on the first net 420-1. However, the slight increase in the parasitic resistance of the first net 420-1 is outweighed by the parallelization of vias on the second net 420-2, which results in an overall reduction of parasitic resistance across the nets 420-1 and 420-2. In other words, the exemplary layout allows both nets 420-1 and 420-2 to benefit from the parallelization of vias, resulting in an overall reduction of parasitic resistance.

In the example in FIG. 6, the vias 610-1 to 610-4 and 620-1 to 620-4 may be patterned using a two-mask (i.e., dual mask) process that allows minimum spacing between vias in one of lateral direction 450 and lateral direction 650. In this example, the minimum spacing may be selected for lateral direction 650. Since the nets 420-1 and 420-2 are spaced apart in lateral direction 650, this allows the via spacing s2 between the first net 420-1 and the second net 420-2 (i.e., neighboring nets) to be equal to the minimum spacing in this example. It is to be appreciated that the present disclosure is not limited to a two-mask process for patterning the vias 610-1 to 610-4 and 620-1 to 620-4. For example, in other implementations, three or more masks may be used.

In the example shown in FIG. 6, the vias 610-1 to 610-4 on the first net 420-1 are uniformly spaced apart. However, it is to be appreciated that the present disclosure is not limited to this example. In certain aspects, the spacing s1 may refer to the spacing between two adjacent vias on the first net 420-1 (e.g., spacing between vias 610-1 and 610-2).

As used herein, two vias on the same net are adjacent to each other when there is no intervening via on the same net between the two vias.

In the example in FIG. 6, the spacing s3 between the vias 620-1 to 620-4 on the second net 420-2 may be the same as the spacing s1 between the vias 610-1 to 610-4 on the first net 420-1. However, it is to be appreciated that the present disclosure is not limited to this example.

FIG. 6 also shows an example of vias 615-1 to 615-4 disposed on the third net 420-3. For example, the vias 615-1 to 615-4 may electrically couple the third net 420-3 to another net (not shown) formed from a metal layer that is above the metal layer used to form the third net 420-3. For example, if the third net 420-3 is formed from metal layer M1, then the other net may be formed from metal layer M2. However, it is to lie appreciated that the present disclosure is not limited to this example.

In the example in FIG. 6, the spacing s4 between the vias 615-1 to 615-4 on the third net 420-3 is greater than the minimum spacing between vias discussed above. In certain aspects, spacing s4 may be equal to spacing s1. In one example, the spacing s4 between the vias 615-1 to 615-4 on the third net 420-3 is greater than 1.1 times the minimum spacing. In another example, the spacing s4 between the vias 615-1 to 615-4 on the third net 420-3 is greater than 1.3 times the minimum spacing. In yet another example, the spacing s4 between the vias 615-1 to 615-4 on the third net 420-3 is greater than 1.5 times the minimum spacing. In the example in FIG. 6, the spacing s4 is equal to the spacing between adjacent vias 615-1 to 615-4 on the third net 420-3. Note that the spacing s4 is in lateral direction 450 in this example since the third net 420-3 extends in lateral direction 450.

Thus, in this example, the spacing s4 between the vias 615-1 to 615-4 on the third net 420-3 is greater than the minimum spacing between vias specified by the design rules. The greater spacing s4 removes the exclusion zone 520-2 on the fourth net 420-3 shown in FIG. 5. The removal of the exclusion zone 520-2 allows vias to be placed on the fourth net 420-4, which neighbors the third net 420-3. In this regard, FIG. 6 shows an example of vias 625-1 to 625-4 disposed on the fourth net 420-3. The vias 625-1 to 615-4 on the fourth net 420-4 provide parallelization of vias on the fourth net 420-4, which reduces the parasitic resistance of the fourth net 420-4 compared with FIG. 5. Thus, the exemplary layout shown in FIG. 6 allows for parallelization of vias on the fourth net 420-4 (i.e., the neighboring net to the third net 420-3).

In one example, the via spacing s5 between the third net 420-3 and the fourth net 420-4 may be equal to the minimum spacing between vias specified by the design rules (i.e., s5=m). The via spacing s5 may refer to the spacing between one of the vias 615-1 to 615-4 on the third net 420-3 and a closest one of the vias 625-1 to 625-4 on the fourth net 420-4, as shown in FIG. 6. For example, the vias spacing s5 may refer to the spacing between via 625-1 on the fourth net 420-4 and via 615-1 on the third net 420-3 where via 615-1 is the via on the third net 420-3 that is closest to via 625-1. In the example in FIG. 6, spacing s5 is in lateral direction 650.

In certain aspects, spacing s5 may be equal to spacing s2. Thus, in this example, the minimum spacing between vias is used for the via spacing s5 between the third net 420-3 and the fourth net 420-4 (i.e., neighboring nets) instead of the spacing s4 between the vias 615-1 to 615-4 on the third net 420-3 (i.e., the same net). However, it is to be appreciated that the present disclosure is not limited to this example, and that the via spacing s5 may be greater than the minimum spacing. For example, the vias spacing s5 may be within a range of the minimum spacing to 1.1 times the minimum spacing. In general, the spacing s4 between the vias 615-1 to 615-4 on the third net 420-3 (i.e., the same net) is greater than the via spacing s5 between the third net 420-3 and the fourth net 420-4 (i.e., neighboring nets). In one example, the ratio of the spacing s4 to the spacing s5 is equal to or greater than 1.1. In another example, the ratio of the spacing s4 to the spacing s5 is equal to or greater than 1.3. In yet another example, the ratio of the spacing s4 to the spacing s5 is equal to or greater than 1.5.

The greater spacing s4 between the vias 615-2 to 625-4 in FIG. 6 compared with FIG. 5 slightly increases the parasitic resistance of the third net 420-3 due to reduced parallelization of the vias on the third net 420-3. However, the slight increase in the parasitic resistance of the third net 420-3 is outweighed by the parallelization of vias on the fourth net 420-4, which results in an overall reduction of parasitic resistance across the nets 420-3 and 420-4. In other words, the exemplary layout allows both nets 420-3 and 420-4 to benefit from the parallelization of vias, resulting in an overall reduction of parasitic resistance.

In the example in FIG. 6, the vias 615-1 to 615-4 and 625-1 to 625-4 may be patterned using a two-mask (i.e., dual mask) process that allows minimum spacing between vias in one of lateral direction 450 and lateral direction 650. In this example, the minimum spacing may be selected for lateral direction 650. Since the nets 420-3 and 420-4 are spaced apart in lateral direction 650, this allows the via spacing s5 between the third net 420-3 and the fourth net 420-4 (i.e., neighboring nets) to be equal to the mini mum spacing between vias in this example. It is to be appreciated that the present disclosure is not limited to a two-mask process for patterning the vias 615-1 to 615-4 and 625-1 to 625-4. For example, in other implementations, three or more masks may be used.

In the example shown in FIG. 6, the vias 615-1 to 615-4 on the third net 420-3 are uniformly spaced apart. However, it is to be appreciated that the present disclosure is not limited to this example. In certain aspects, the spacing s4 may refer to the spacing between two adjacent vias on the third net 420-3 (e.g., spacing between vias 615-1 and 615-2).

In the example in FIG. 6, the spacing s6 between the vias 625-1 to 625-4 on the fourth net 420-4 tray be the same as the spacing s4 between the vias 615-1 to 615-4 on the third net 420-3. However, it is to be appreciated that the present disclosure is not limited to this example.

Thus, in the above example, the use of non-minimum spacing for vias on the same net slightly increases parasitic resistance for the first net 420-1 and the third net 420-3 compared with the layout approach illustrated in FIG. 5. However, the parallelization of vias on the neighboring nets (i.e., the second net 420-2 and the fourth net 420-4) results in an overall reduction in parasitic resistance (e.g., across all terminals of the transistor 110), which out weights the slight increase in parasitic resistance for the first net 420-2 and the third net 420-3. In other words, the exemplary layout approach illustrated in FIG. 6 allows all nets 420-1, 420-2, 420-3, and 420-4 to benefit from the parallelization of vias, resulting in an overall reduction of parasitic resistance.

In the example shown in FIG. 6, the nets 420-1, 420-2, 420-3, and 420-4 extend in lateral direction 450, and are spaced apart from one another in lateral direction 650, where lateral direction 650 is perpendicular to lateral direction 450. Also, in this example, the spacings s1, s3, s4, and s6 between vias on the same net are in the lateral direction 450 and the spacings s2 and s5 between vias on neighboring nets are in the lateral direction 650. However, it is to be appreciated that the present disclosure is not limited to this example.

In the example shown in FIG. 6, the nets 420-1, 420-2, 420-3, and 420-4 are shown having generally rectangular shapes. However, it is to be appreciated that the nets 420-1, 420-2, 420-3, and 420-4 may have other shapes. In certain aspects, each of the nets 420-1, 420-2, 420-3, and 420-4 is contiguous but may have any one of a variety of different shapes.

Also, it is to be appreciated that the nets 420-1, 420-2, 420-3, and 420-4 are not limited to the drain, first gate, the source, and the second gate (i.e., D, G, S, G), respectively. In general, the nets 420-1, 420-2, 420-3, and 420-4 may be any nets that are different from each other.

In the example shown in FIG. 6, the second net 420-2 and the third net 420-3 are also neighboring nets. The via spacing s7 shown in FIG. 6 may refer to the spacing between one of the vis 620-1 to 620-4 on the second net 420-2 and the closest one of the vias 615-1 to 615-4 on the third net 420-3. For example, the via spacing s7 may refer to the spacing between via 620-1 on the second net 420-1 and via 615-1 on the third net 420-3 where via 615-1 is the via on the third net 420-3 that is closest to via 620-1. In one example, the via spacing s7 between the second net 420-2 and the third net 420-3 may be equal to the minimum spacing between vias specified by the design rules (i.e., s7=m). However, it is to be appreciated that the present disclosure is not limited to this example, and that the via spacing s7 may be greater than the minimum spacing. For example, the vias spacing s7 may be within a range of the minimum spacing to 1.1 times the minimum spacing. In general, the spacing s4 between the vias 615-1 to 615-4 on the third net 420-3 (i.e., the same net) is greater than the via spacing s7 between the second net 420-2 and the third net 420-3 (i.e., neighboring nets). In one example, the ratio of the spacing s4 to the spacing s7 is equal to or greater than 1.1. In another example, the ratio of the spacing s4 to the spacing s7 is equal to or greater than 1.3. In yet another example, the ratio of the spacing s4 to the spacing s7 is equal to or greater than 1.5.

Figure 7:
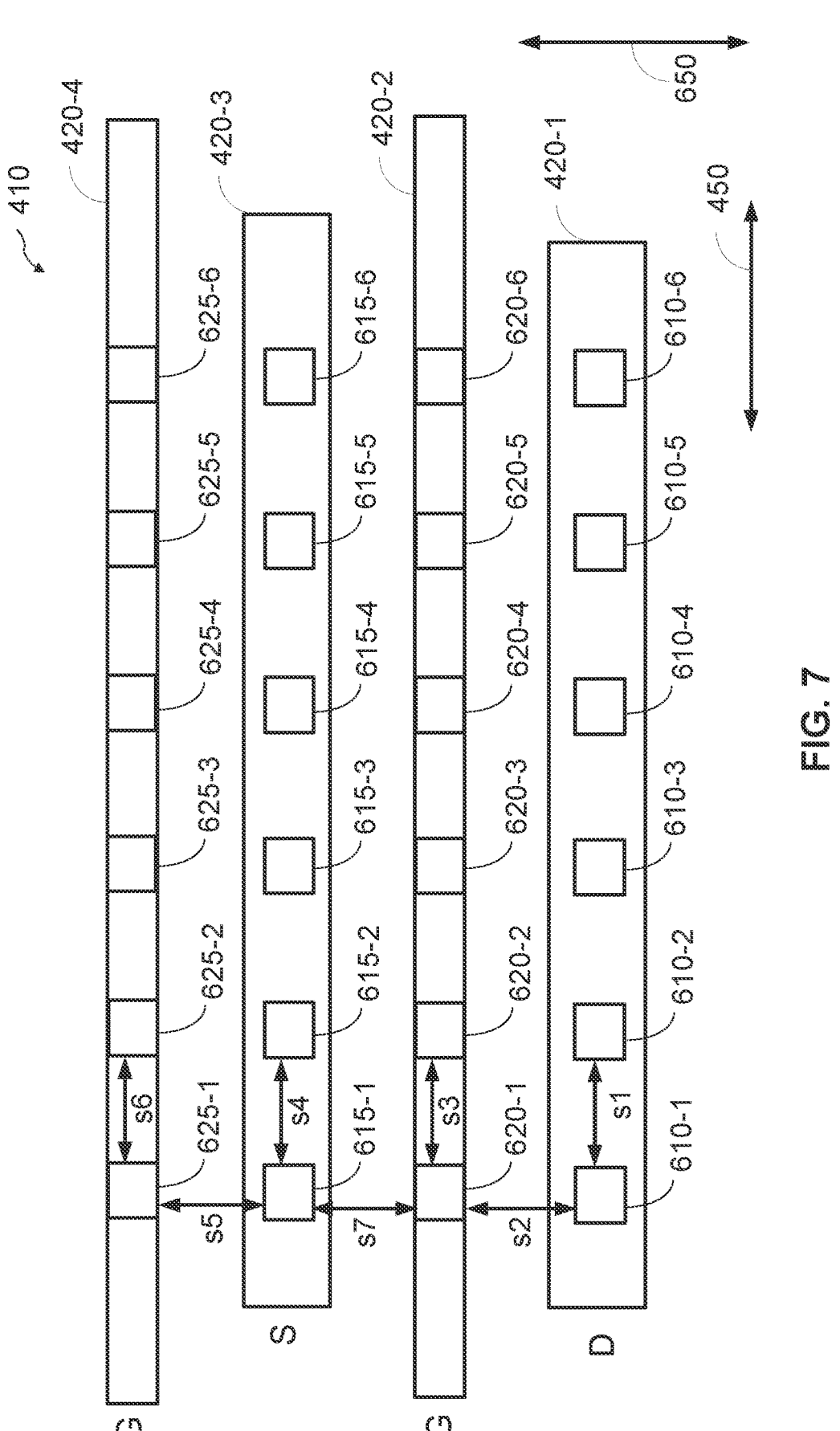
FIG. 7 shows an example of a layout using minimum spacing between vias in two directions according to certain aspects of the present disclosure.

In certain aspects, the vias 610-1 to 610-4, 615-1 to 615-4, 620-1 to 620-4, and 625-1 to 625-4 may be patterned using a multi-mask lithographic process that allows minimum spacing in both lateral direction 650 and lateral direction 450. For example, the multi-mask lithographic may use more than two masks and/or a combination of extreme ultraviolet lithography (also referred to as EUV) and one or more masks. In this example, the multiple masks and/or EUV allows minimum spacing for vias on the same net without the exclusion zones 520-1 and 520-2 shown in FIG. 5. In this regard, FIG. 7 shows an example in which the spacing s1, s3, s4, and s6 between vias 610-1 to 610-6, 615-1 to 615-6, 620-1 to 620-6, and 625-1 to 625-6 on the same net is equal to the minimum spacing, and the via spacing s2, s5, and s7 is equal to the minimum spacing. Using minimum spacing in both directions 450 and 650 increases via parallelization, further reducing parasitic resistance.

It is to be appreciated that the spacings s1 to s7 do not have to be exactly equal to the minimum spacing defined by the design rules. In certain aspects, each of the spacings s1 to s7 or each of a subset of the spacings s1 to s7 may be within a range of the minimum spacing to 1.1 times the minimum spacing. For example, the spacing s1 may be within a range of the minimum spacing to 1.1 times the minimum spacing where the spacing s1 may refer to the spacing between two adjacent vias on the first net 420-1 (e.g., spacing between vias 610-1 and 610-2). In another example, the via spacing s2 between the second net 420-2 and the first net 420-1 may be within a range of the minimum spacing to 1.1 times the minimum spacing. The via spacing s2 may refer to the spacing between one of the vias 620-1 to 620-4 on the second net 420-2 and a closest one of the vias 610-1 to 610-4 on the first net 420-1, as shown in FIG. 7. For example, the via spacing s2 may refer to the spacing between via 620-1 on the second net 420-1 and via 610-1 on the first net 420-1 where via 610-1 is the via on the first net 420-1 that is closest to via 620-1.

As used herein, a spacing within a range of the minimum spacing to 1.1 times the minimum spacing includes any one of a spacing equal to the minimum spacing, a spacing equal to 1.1 times the minimum spacing, or a spacing between the minimum spacing and 1.1 times the minimum spacing.

Implementation examples are described in the following numbered clauses:

1. A chip, comprising:
   a first net;
   a second net, wherein the first net and the second net are formed from a same metal layer, and the second net neighbors the first net;
   first vias disposed on the first net; and
   second vias disposed on the second net;
   wherein a first spacing is greater than a second spacing, the first spacing is between a first one of the first vias and a second one of the first vias, the first one of the first vias and the second one of the first vias are adjacent, and the second spacing is between the first one of the first vias and one of the second vias closest to the first one of the first vias.

2. The chip of clause 1, wherein the first spacing is greater than 1.1 times a minimum spacing specified by a design rule.

3. The chip of clause 2, wherein the second spacing is within a range of the minimum spacing to 1.1 times the minimum spacing.

4. The chip of clause 1, wherein the first spacing is greater than 1.3 times a minimum spacing specified by a design rule.

5. The chip of clause 1, wherein the first spacing is greater than 1.5 times a minimum spacing specified by a design rule.

6. The chip of any one of clauses 1 to 5, wherein a ratio of the first spacing to the second spacing is greater than 1.1.

7. The chip of any one of clauses 1 to 5, wherein a ratio of the first spacing to the second spacing is greater than 1.3.

8. The chip of any one of clauses 1 to 5, wherein a ratio of the first spacing to the second spacing is greater than 1.5.

9. The chip of any one of clauses 1 to 8, wherein the first net comprises a first contiguous metal line and the second net comprises a second contiguous metal line.

10. The chip of any one of clauses 1 to 9, wherein:
    the first net is electrically coupled to a source or a drain of a transistor; and
    the second net is electrically coupled to a gate of the transistor.

11. The chip of any one of clauses 1 to 10, further comprising:
    a third net, wherein the third net is formed from the same metal layer as the first net and the second net, and the third net neighbors the second net; and
    third vias disposed on the third net;
    wherein a third spacing is greater than a fourth spacing, the third spacing is between a first one of the third vias and a second one of the third vias, the first one of the third vias and the second one of the third vias are adjacent, and the fourth spacing is between the first one of the third vias and one of the second vias closest to the first one of the third vias.

12. The chip of clause 11, wherein:
    the first net is electrically coupled to a drain of a transistor;
    the second net is electrically coupled to a gate of the transistor; and
    the third net is electrically coupled to a source of the transistor.

13. The chip of clause 11 or 12, wherein the first spacing and the third spacing are each greater than 1.1 times a minimum spacing specified by a design rule.

14. The chip of clause 11 or 12, wherein the first spacing and the third spacing are each greater than 1.3 times a minimum spacing specified by a design rule.

15. The chip of clause 11 or 12, wherein the first spacing and the third spacing are each greater than 1.5 times a minimum spacing specified by a design rule.

16. A chip, comprising:
    a first net;
    a second net, wherein the first net and the second net are formed from a same metal layer, and the second net neighbors the first net;
    first vias disposed on the first net; and
    second vias disposed on the second net:
    wherein a first spacing is between a first one of the first vias and a second one of the first vias, the first one of the first vias and the second one of the first vias are adjacent, a second spacing is between the first one of the first vias and one of the second vias closest to the first one of the first vias, and each of the first spacing and the second spacing is within a range of a minimum spacing specified by a design rule to 1.1 times the minimum spacing.

17. The chip of clause 16, wherein the first net comprises a first contiguous metal line and the second net comprises a second contiguous metal line.

18. The chip of clause 16 or 17, wherein:
    the first net is electrically coupled to a source or a drain of a transistor; and
    the second net is electrically coupled to a gate of the transistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:

a first net;

a second net, wherein the first net and the second net are formed from a same metal layer, and the second net neighbors the first net;

first vias disposed on the first net;

second vias disposed on the second net;

a third net, wherein the third net is formed from the same metal layer as the first net and the second net, and the third net neighbors the second net; and third vias disposed on the third net;

wherein a first spacing is greater than a second spacing, the first spacing is between a first one of the first vias and a second one of the first vias, the first one of the first vias and the second one of the first vias are adjacent, and the second spacing is between the first one of the first vias and one of the second vias closest to the first one of the first vias; and wherein a third spacing is greater than a fourth spacing, the third spacing is between a first one of the third vias and a second one of the third vias, the first one of the third vias and the second one of the third vias are adjacent, and the fourth spacing is between the first one of the third vias and one of the second vias closest to the first one of the third vias.

2. The chip of claim 1, wherein the first spacing is greater than 1.1 times a minimum spacing specified by a design rule.

3. The chip of claim 2, wherein the second spacing is within a range of the minimum spacing to 1.1 times the minimum spacing.

4. The chip of claim 1, wherein the first spacing is greater than 1.3 times a minimum spacing specified by a design rule.

5. The chip of claim 1, wherein the first spacing is greater than 1.5 times a minimum spacing specified by a design rule.

6. The chip of claim 1, wherein a ratio of the first spacing to the second spacing is greater than 1.1.

7. The chip of claim 1, wherein a ratio of the first spacing to the second spacing is greater than 1.3.

8. The chip of claim 1, wherein a ratio of the first spacing to the second spacing is greater than 1.5.

9. The chip of claim 1, wherein the first net comprises a first contiguous metal line and the second net comprises a second contiguous metal line.

10. The chip of claim 1, wherein:

the first net is electrically coupled to a source or a drain of a transistor; and the second net is electrically coupled to a gate of the transistor.

11. The chip of claim 1, wherein:

the first net is electrically coupled to a drain of a transistor;

the second net is electrically coupled to a gate of the transistor; and the third net is electrically coupled to a source of the transistor.

12. The chip of claim 1, wherein the first spacing and the third spacing are each greater than 1.1 times a minimum spacing specified by a design rule.

13. The chip of claim 1, wherein the first spacing and the third spacing are each greater than 1.3 times a minimum spacing specified by a design rule.

14. The chip of claim 1, wherein the first spacing and the third spacing are each greater than 1.5 times a minimum spacing specified by a design rule.

* * * * *